(12) United States Patent
Nakayama (10) Patent No.: US 6,320,913 B1
(45) Date of Patent: Nov. 20, 2001

(54) CIRCUIT AND METHOD FOR CONTROLLING TRANSMISSION AMPLIFIERS

(75) Inventor: Masahiko Nakayama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/102,415

(22) Filed: Jun. 22, 1998

(30) Foreign Application Priority Data

Jun. 23, 1997 (JP) .................................................... 9-166070

(51) Int. Cl.[7] .............................. H04K 1/02; H04L 25/03; H04L 25/49
(52) U.S. Cl. .............................................. 375/297; 330/51
(58) Field of Search ..................................... 375/295, 297, 375/296; 330/52, 124 R, 124 D, 125, 126; 455/115, 118, 127, 126

(56) References Cited

U.S. PATENT DOCUMENTS

| | | | |
|---|---|---|---|
| 5,862,461 | * | 1/1999 | Yoshizawa et al. ................. 455/127 |
| 5,872,481 | * | 2/1999 | Sevic et al. .............................. 330/51 |
| 5,923,213 | * | 7/1999 | Darthenay et al. ..................... 330/51 |
| 6,137,355 | * | 10/2000 | Sevic et al. ............................. 330/51 |

FOREIGN PATENT DOCUMENTS

| | | |
|---|---|---|
| 60-212013 | 10/1985 | (JP) . |
| 63-156431 | 6/1988 | (JP) . |

\* cited by examiner

*Primary Examiner*—Chi Pham
*Assistant Examiner*—Phuong Phu
(74) *Attorney, Agent, or Firm*—Ostrolenk, Faber, Gerb & Soffen, LLP (57) ABSTRACT

A transmission amplifier control circuit which is capable of preventing an adverse effect such as data erroneous transmission due to variations in phase which may occur when plural amplifiers are switched and capable of improving the transmission efficiency and suppressing extra power consumption. The transmission amplifier control circuit includes amplification means $5_1$ to $5_n$; switching means 6 for selectively switching at least one of the plural amplification means $5_1$ to $5_n$; detection means 2 for detecting a timing at which the plural amplification means $5_1$ to $5_n$ are switched, using the format of data to be transmitted during data transmission; and amplification means changeover control means 3 for controlling a timing for switching the plural amplification means $5_1$ to $5_n$, using both a detection signal from the detection means 2 and an output power control signal which is externally input and controls the output power of the transmission amplifier control circuit. Each of the plural amplification means $5_1$ to $5_n$ can have a different maximum gain.

12 Claims, 6 Drawing Sheets

CIRCUIT AND METHOD FOR CONTROLLING TRANSMISSION AMPLIFIERS

BACKGROUND OF THE INVENTION

The present invention relates to a transmission amplifier control circuit for a mobile communication transmitter and more particularly to a circuit for controllably switching plural transmission power amplifiers according to transmission power. The present invention also relates to a method for controlling transmission amplifiers.

Recently, demands for mobile communication have caused a shortage of the number of channels. The CDMA (Code Division Multiple Access) system that provides a high frequency use efficiency has been come to attention for the mobile communication. The CDMA system requires an accurate, wide-range transmission power output control.

The spread spectrum system such as CDMA has the problem of distance which occurs in a difference in distance between a base station and each of terminals linked with the base station by radio and a difference between radio propagation paths. The base station, for example, receives a weak signal from a remote terminal and a strong signal from a nearby terminal. Hence, in the CDMA system in which all users utilize the same frequency, the receive signal from a remote terminal interferes with the strong signal from a nearby terminal. This is called the distance problem. To avoid this phenomenon, a good approach is that the base station equalizes receive power levels from respective terminals linked by radio. This requires that as the terminal moves, its transmission power is dynamically and accurately controlled. Various countermeasures have been proposed to vary the transmission output power.

Figure 5:
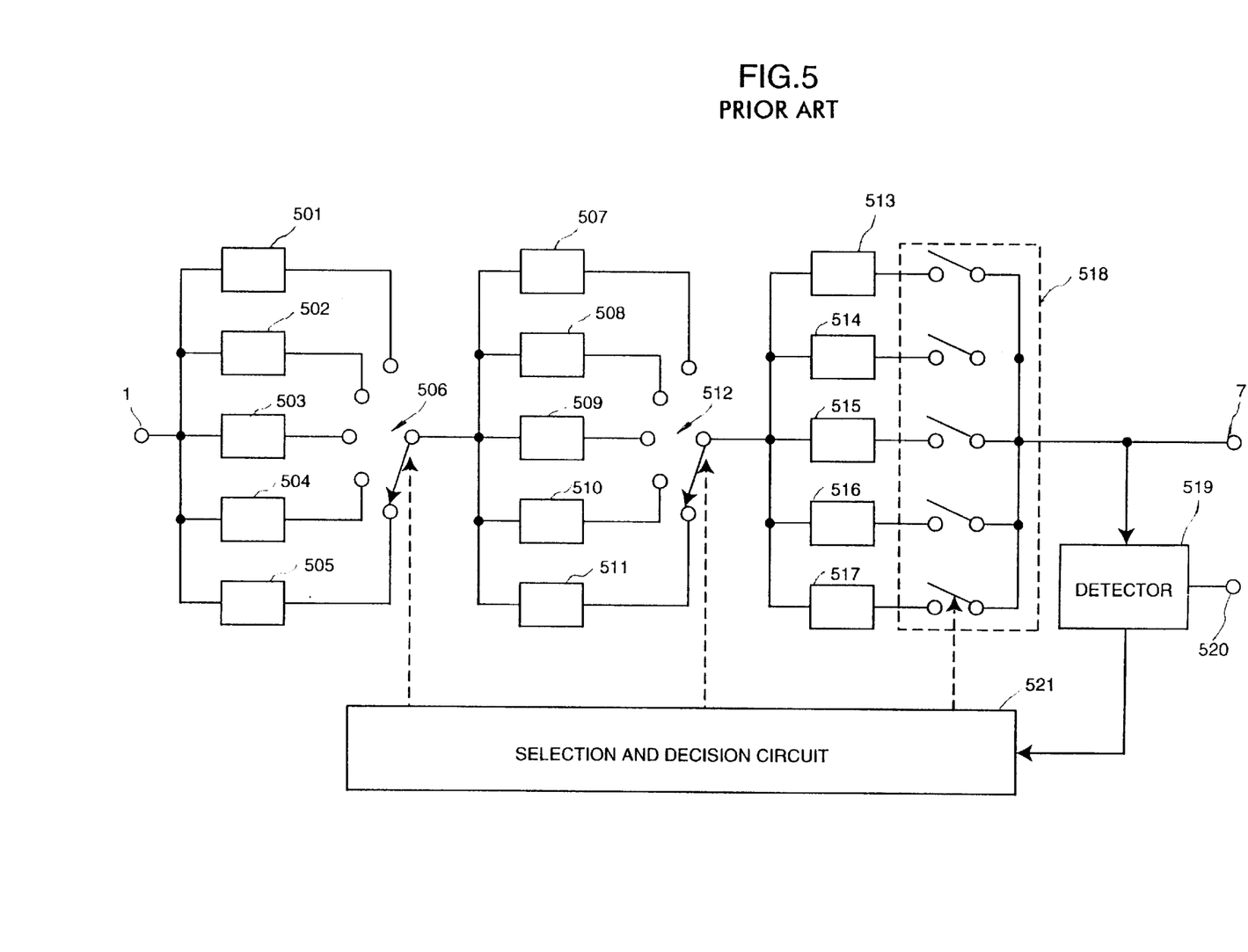
FIG. 5 is a block diagram illustrating the configuration of a conventional multistage amplifier.

One of methods of that type for obtaining a variable gain is a method for selectively using plural amplifiers. FIG. 5 is a block diagram illustrating the configuration of a prior art multistage amplifier. This configuration is disclosed by FIG. 3 in JP-A-212013/1985 (hereinafter referred to as Publication 1). The prior art method of selectively using plural amplifiers will be described below with reference to FIG. 5.

The multistage amplifier 5 shown in FIG. 5 consists of amplifiers 501 to 505, 507 to 511, and 513 to 517, selectors 506, 512, and 518, a detector 519, and a selection and decision circuit 521. In this configuration, the amplifiers 501 to 505 at the first stage each which has a different gain receives an input signal via the input terminal 1. The outputs of the amplifiers 501 to 505 are connected to the selector 506. The selector 506 selectively connects any one of the amplifiers 501 to 505 to the amplifiers 507 to 511 at the next stage. In such an operation, plural amplifier groups are connected in cascade mode. The outputs of the amplifiers 513 to 517 at the final stage are connected to the selectors 518 acting as a switch. The selection and decision circuit 521 decides an increase or decrease in gain according to a comparison result between a detection output detected by the detector 519 and a threshold input from the input terminal 520 and then selects a specific amplifier in each of the amplifier groups. This operation realizes the gain control of the entire system.

Figure 6:
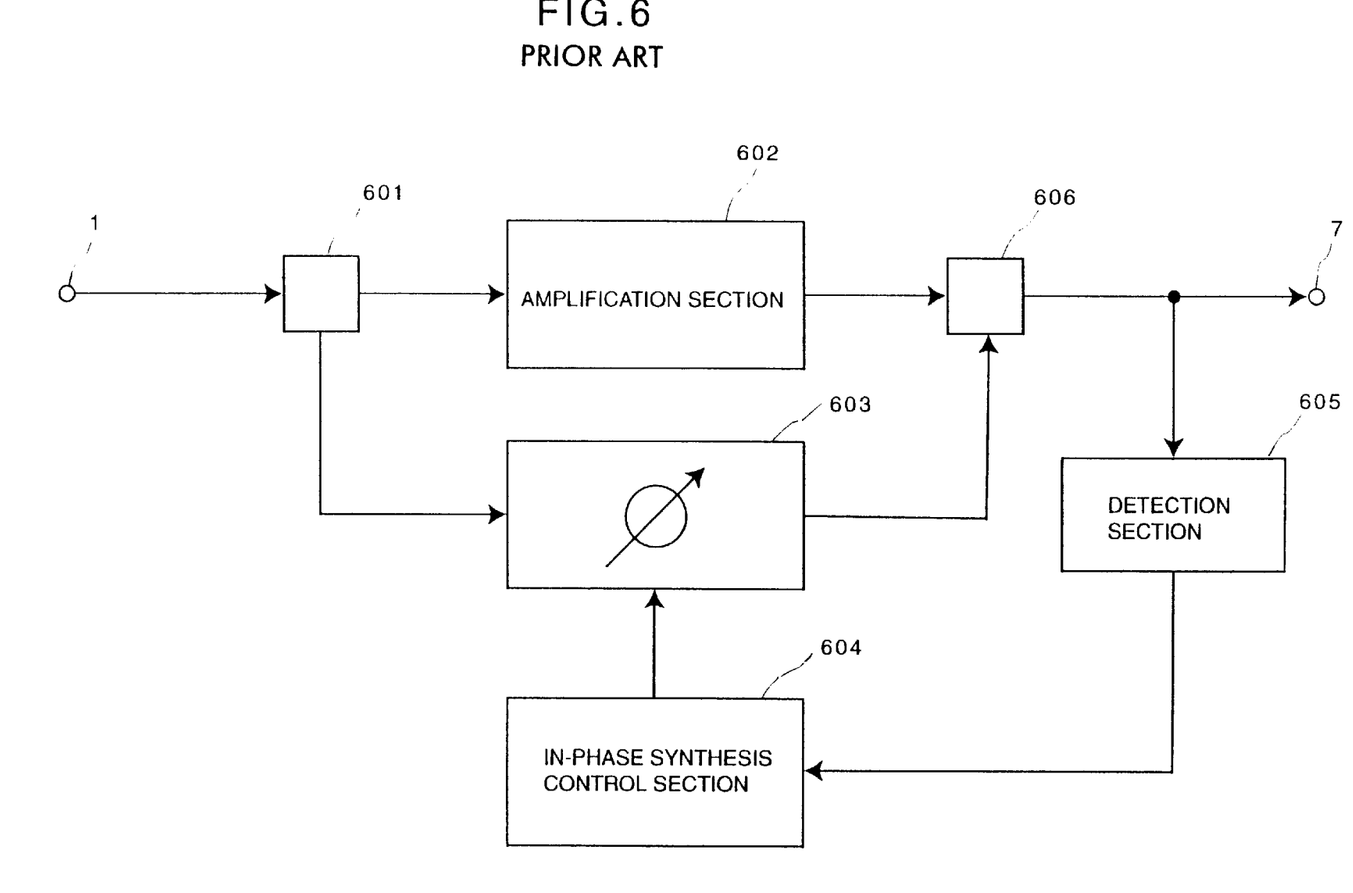
FIG. 6 is a block diagram illustrating the principle of a conventional power changeover amplifier.

FIG. 6 is a block diagram illustrating the principle of a prior art power changeover amplifier which is disclosed in FIG. 1 of JP-A-156431/1988 (hereinafter referred to as publication 2). The power changeover amplifier of FIG. 6 aims at realizing the method of selecting an amplifier to suppress power consumption at a transmission time or the method of selecting an amplifier without adversely affecting a signal to be transmitted at a power switching time. The switching control method in a prior art power changeover amplifier will be described below by referring to FIG. 6.

The power changeover amplifier shown in FIG. 6 consists of a front-stage switching section 601, an amplifier 602, a variable phase shifter 603, an in-phase synthesis control section 604, a detection section 605, and a rear-stage switching section 606. In this arrangement, the bypass section (including the front-stage switching section 601, the variable phase shifter 603, and the rear-stage switching section 606) has the variable phase shifter 603 controlled by the in-phase synthesis control section 604 and is connected in parallel to the amplifier 602 to execute a power switching operation.

In this configuration, the front-stage amplifier 601 receives an input signal via the input terminal 1 at the time of a normal power outputting operation and then outputs an output signal to the output terminal 7 via the amplifier 602 and the rear-stage switching section 606. An input signal is input via the input terminal 1 at the time of a low power outputting operation. The front-stage amplifier 601 leads the input signal to the bypass section. Then the bypass section outputs an output signal to the output terminal 7 via the rear-stage switching section 606. At the transition from a normal power outputting time to a low power outputting time or from a low power outputting time to a normal power outputting time, the output power at the low power outputting time is temporarily mixed with the output power at the output of the normal power outputting time at the output of the rear-stage switching section 606. Problems do not occur when the mixing is mutually performed in phase. However, a mutual phase shift actually is unavoidable at a power mixing time. To avoid such a problem, the detection section 604 detects a phase shift. The phase synthesis control section 604 controls the variable phase shifter 603 according to the detected phase shift to set the phase shift to zero. In this operation, the switching operation can be simultaneously performed from the normal power outputting time to the low power outputting time or from the low power outputting time to the normal power outputting time with no occurrence of a phase shift.

A first problem is that the power changeover amplifier as illustrated in FIG. 6 has no timing control means for switching amplifier means because a phase shift (sometimes called phase rotation) occurs due to a momentary break of a transmission signal or selection of amplifier means when the amplifier means is changed during continuous signal transmission, so that the receiver cannot modulate the transmission signal and an error occurs in receive data. Particularly, in the transmitter and receiver employing the phase modulation according to the synchronous detection scheme, since information is allocated to a phase, an error occurs in receive data when the phase of the transmission data shifts with respect to the pilot signal being the reference of the transmission data.

The second problem is that in the prior art combination of amplifiers connected in a multistage state shown in FIG. 5, the selection and decision circuit selects an amplifier using a signal detected by the detector that detects the output power from the multistage amplifier. That arrangement is effective to saturation of the output power. However, since the gain of the entire system is decided by a combination of fixed gain values, an increased number of amplification stages are required for a fine gain adjustment.

The third problem is that the prior art power changeover amplifier shown in FIG. 6 is not suitable to vary the gain over a wide range. This system is effective to handle signals serially chained because the amplifier can be selected under the in-phase synthesis control, with the phase continued. However, the switching operation must be made in two levels including a normal power outputting operation and a low power suppressing operation by bypassing.

FIG. 6 does not show the power changeover amplifier including a great number of amplifiers connected. The power changeover amplifier corresponds to deal with a specific fading. Hence, where amplifiers each of which has a different gain are connected in a multistage mode to execute a wide gain control, it is needed to control a great number of amplifiers each to which a variable phase shifter is added. Such an arrangement has the problem of resulting in a large circuit scale and complicated control to each amplifier. Such a configuration is not suitable to a mobile communication such as a portable digital mobile communication terminal which must be configured in a compact size.

SUMMARY OF THE INVENTION

The objective of the present invention is to solve the above-mentioned problems.

A further object of the present invention is to provide a transmission amplifier control circuit capable of preventing an adverse effect such as data erroneous transmission due to variations in phase which may occur when pural amplifiers are switched.

Another object of the present invention is to provide a transmission amplifier control circuit capable of improving the transmission efficiency and suppressing extra power consumption.

Furthermore, the objective of the present invention is to provide a method for controlling transmission amplifiers.

In order to accomplish the above mentioned objects, the objective of the present invention is achieved by the transmission amplifier control circuit that comprises plural amplification means; switching means for selectively switching at least one of the plural amplification means; detection means for detecting a timing at which the plural amplification means are switched, using the format of data to be transmitted during data transmission; and amplification means changeover control means for controlling a timing for switching the plural amplification means, using both a detection signal from the detection means and an output and controls the output power of the transmission amplifier control circuit.

In the transmission amplifier control circuit according to the present invention, each of the plural amplification means has a different maximum gain.

According to the present invention, the transmission amplifier control circuit further comprises a signal processing section connected to the plural amplification means, for controlling the data according to a variable gain control signal from the amplification means changeover control means.

In the transmission amplifier control circuit according to the present invention, the signal processing section comprises a modulation circuit for modulating the data to output a modulation signal; an intermediate frequency variable gain amplifier for controlling the modulation signal according to the variable gain control signal; and a frequency conversion circuit for converting a signal output from the intermediate frequency variable gain amplifier into a signal of a desired frequency.

In the transmission amplifier control circuit, the data contains a pilot symbol signal of which the phase is handled as a reference phase at a receiving time.

In the transmission amplifier control circuit according to the present invention, the detection means comprises a comparator for comparing a pilot symbol pattern contained in data with a pilot symbol pattern; a timing clock generation circuit for producing a changeover timing clock signal; and storage means for storing the pilot symbol pattern.

In the transmission amplifier control circuit according to the present invention, the pilot symbol signal is periodically inserted in the data.

In the transmission amplifier control circuit according to the present invention, the amplification means changeover control means comprises a threshold value comparison circuit for comparing the threshold value of the output power control signal with an output power control signal value; an intermediate frequency variable gain amplifier control circuit for generating a control signal to the intermediate frequency gain amplifier; and a changeover control circuit for controlling the switching means.

In the transmission amplifier control circuit according to the present invention, the threshold value of the output control signal is set to a value at which each of the amplification means is not saturated.

In the transmission amplifier control circuit according to the present invention, the threshold value is stored in a ROM or RAM.

Moreover, according to the present invention, a method for controlling transmission amplifiers, comprises the steps of detecting a pilot symbol signal pattern contained in a format of transmission data; comparing the pilot symbol pattern with a pilot symbol pattern stored in a memory within a detection section and then outputting a comparison result to an amplifier changeover control circuit; producing a changeover timing clock signal based on the comparison result so as not to adversely affect a phase shift in an amplifier switching operation; producing a control signal to a changeover switch and a variable gain control signal to a signal processing section, in synchronism with the changeover timing clock signal; and selecting an amplifier with a predetermined gain among the transmission amplifiers by controlling the amplifier changeover switch based on the control signal.

In the method according to the present invention, the pilot symbol signal detecting step comprises a step of detecting a timing clock signal at which a pilot symbol signal is combined with the transmission data in a baseband signal processing step.

In the interpolation synchronous detection system, a pilot symbol signal is generally inserted as reference phase information into transmission data. The pilot symbol signal is inserted in a data sequence at predetermined intervals. The receiver demodulates data following the pilot symbol signal by handling the phase of a pilot symbol signal as a reference phase. That is, if the amplification means is not switched between a rise time of a pilot symbol signal and a rise time of the next pilot symbol signal, transmission of error data due to a phase shift can be prevented. Hence, the amplification means is selected immediately before the pilot symbol signal is transmitted, the system is not adversely affected due to the phase shift, so that data can be certainly transmitted without adversely affecting demodulation on the reception side.

The transmission amplifier control circuit of the present invention detects the timing immediately before a pilot symbol signal is transmitted such that an error does not occur in data demodulation at the receiving time even when amplification means is selected during data transmission, and then selectively controls a connection combination of plural amplification means using a detected changeover timing clock signal and information regarding an output power control signal. Thus it is possible to avoid an adverse effect due to the operation of selecting plural amplifier means during data transmission, so that the transmission efficiency can be improved. Moreover, since the amplification means can be selectively switched, unnecessary amplification means is separated off so that waste power consumption can be prevented.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Basic Configuration

Figure 1:
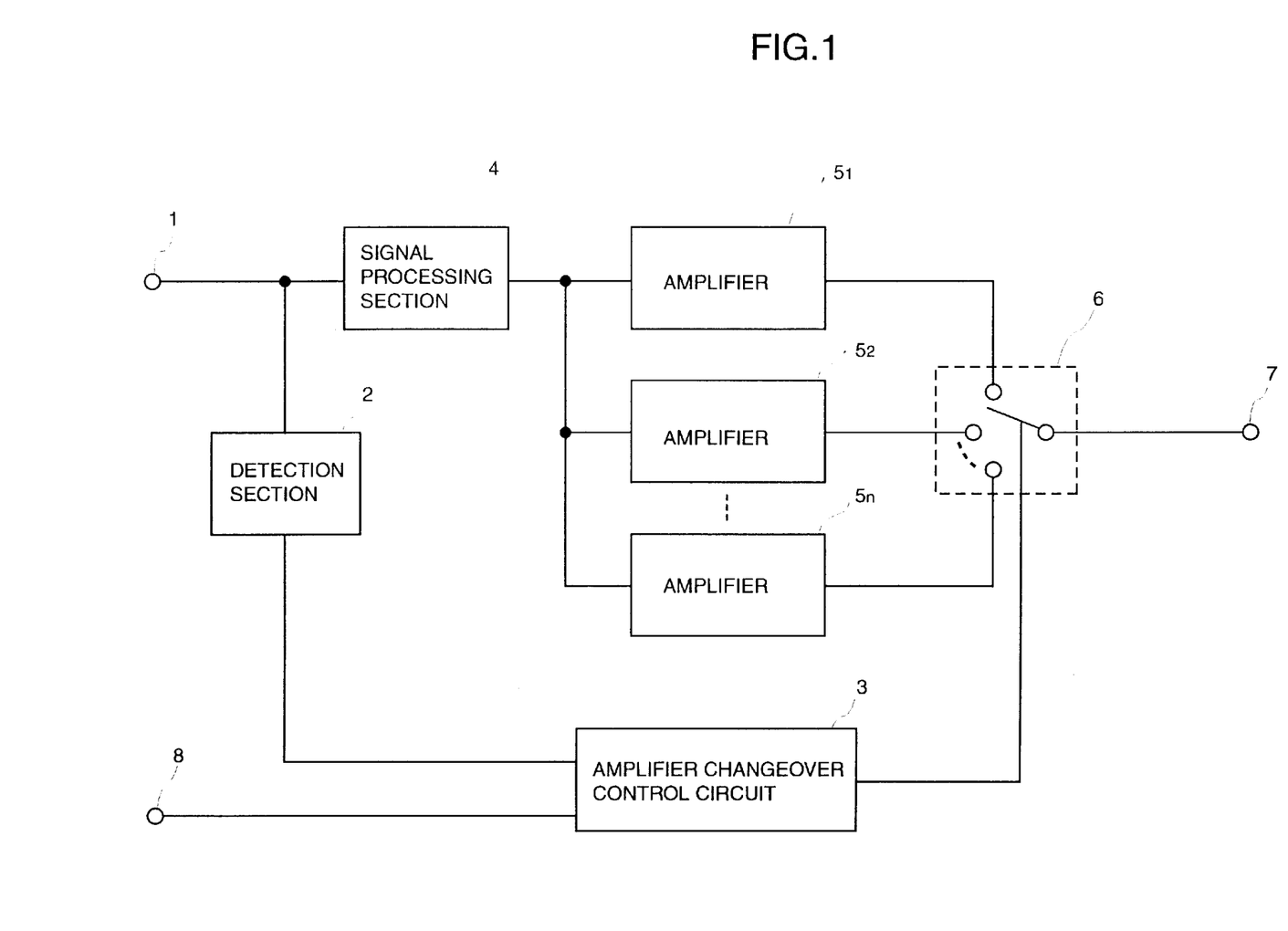
FIG. 1 is a block diagram illustrating the configuration of a transmission amplifier control circuit according to an aspect of the present invention.

FIG. 1 is a block diagram illustrating a transmission amplifier control circuit according to an embodiment of the present invention. FIG. 1 shows a plurality of amplifiers $5_1$ to $5_n$ connected in parallel.

Referring to FIG. 1, the transmission amplifier control circuit consists of n amplifiers $5_1$ to $5_n$ each which has a different gain, a detection section 2 which generates a switching timing clock signal, an amplifier changeover control circuit 3 which selects an amplifier with a given gain among amplifiers $5_1$ to $5_n$, a signal processing section 4, and an amplifier changeover switch 6 which selects a specific one among the amplifiers $5_1$ to $5_n$ and then outputs it to an output terminal 7.

Transmission data is input to the detection section 2 and the signal processing section 4 via the input terminal 1. The signal processing section 4 includes a processing device for executing normal transmission, a filter, an intermediate variable amplifier, a frequency conversion circuit, and a pre-stage driver for the amplifiers $5_1$ to $5_n$. The signal processing section 4 outputs a signal to the amplifiers $5_1$ to $5_n$. The detection section 2 detects a pilot symbol signal of transmission data and then outputs a changeover timing clock signal which controls the timing to select a specific one of the amplifiers $5_1$ to $5_n$. The amplifier changeover control circuit 3 controllably selects the amplifiers $5_1$ to $5_n$ using an output power control signal from an input terminal 8 and the changeover timing clock signal. The amplifier changeover switch 6 connects one selected by the changeover control circuit 3 among the amplifiers $5_1$ to $5_n$ to the output terminal 7.

Basic Operation

A pilot symbol signal is periodically inserted to transmission data input from the input terminal 1. The phase of the pilot symbol signal becomes a reference phase upon its receipt. Hence, when an amplifier is selected while transmission data follows the pilot symbol signal, the reception side may erroneously demodulate the transmission data. To avoid such a problem, it is better to selectively switch the amplifiers $5_1$ to $5_n$ immediately before the pilot symbol signal is transmitted.

The detection section 2 detects a pilot symbol signal based on the transmission data and then generates a changeover timing clock signal. The amplifier changeover control circuit 3 selects a suitable amplifier among the amplifiers $5_1$ to $5_n$ based on the changeover timing clock signal and information regarding up/down operation of transmission power output contained in the output power control signal input on terminal 8. A specific amplifier is selected in synchronism with the changeover timing clock signal to control the transmission power output.

As described above, transmission power can be effectively controlled by selecting an amplifier with a desired gain. The phase shift due to the amplifier selecting operation as well as data defect due to simultaneous break operation can thus be avoided.

Detailed Configuration

Figure 2:
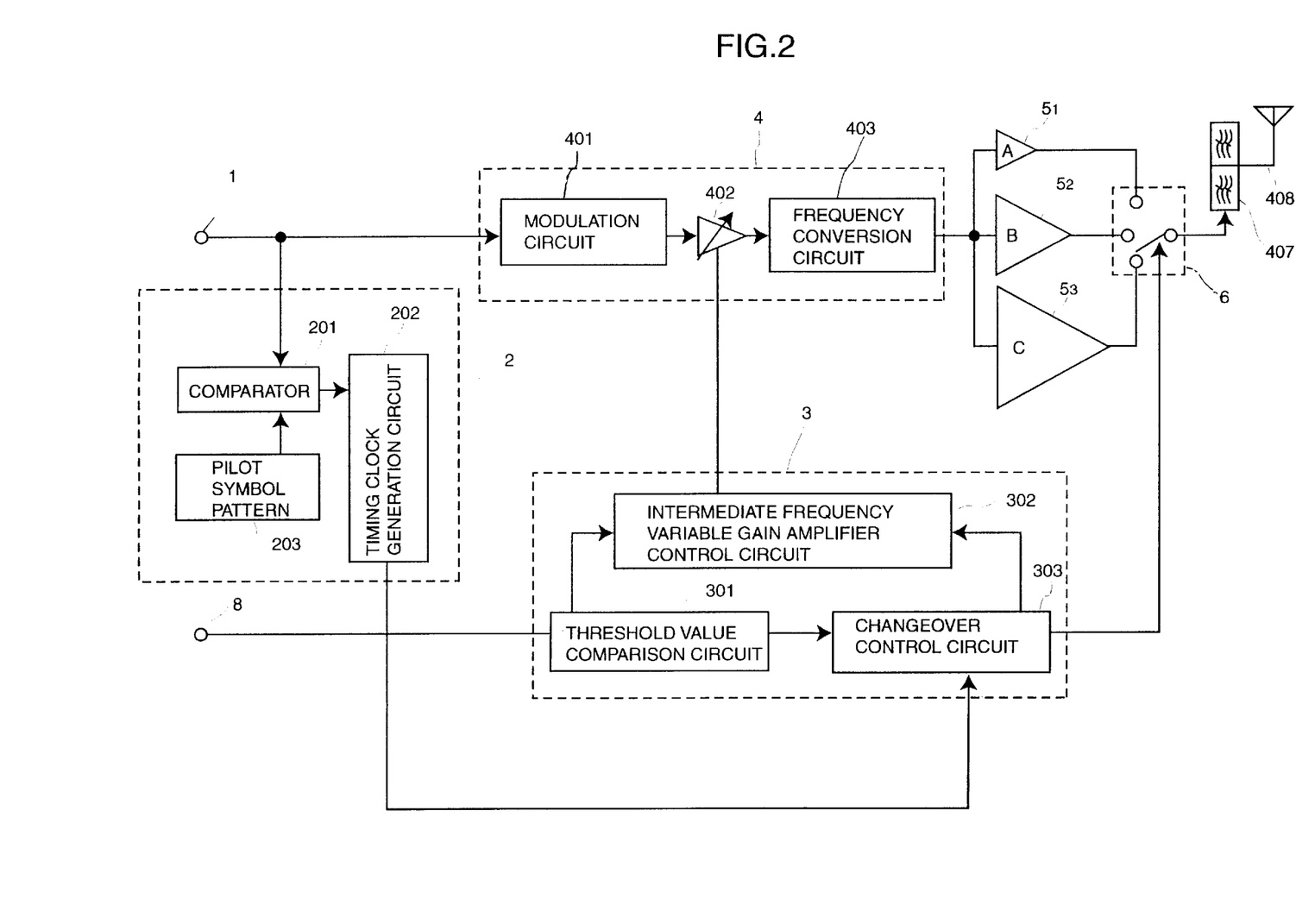
FIG. 2 is a block diagram illustrating the configuration of a transmission amplifier control circuit according to an embodiment of the present invention.

FIG. 2 is a block diagram illustrating the configuration of a transmission amplifier control circuit according to the embodiment of the present invention. FIG. 2 shows in detail the configuration of the transmission amplifier control circuit shown in FIG. 1 which includes three amplifiers $5_1$, $5_2$, and $5_3$. An embodiment of the present invention will be described below by referring to FIG. 2.

Referring to FIG. 2, the transmission amplifier control circuit consists of a detection section 2, an amplifier changeover control section 3, a signal processing section 4, three amplifiers $5_1$ to $5_3$, and an amplifier changeover switch 6. The same numerals as those in FIG. 1 represent the same constituent elements. The detail configuration of each section will be described below.

The detection section 2 includes a comparator 201, a timing clock generating circuit 202, and a pilot symbol pattern 203. The comparator 202 compares transmission data input via the input terminal 1 with the pilot symbol pattern 203 and then inputs the comparison result to the timing clock generation circuit 202. The timing clock generation circuit 202 outputs a changeover timing clock signal.

The amplifier changeover control circuit 3 consists of a threshold value comparison circuit 301 that compares the threshold value of an output power control signal with an output power control signal value input via the input terminal 8, an intermediate frequency variable gain amplifier control circuit 302 that generates control signals to the intermediate frequency gain amplifier 402 (to be described later), and a changeover control circuit 303 that controls the amplifier changeover switch 6. The threshold value comparison circuit 301 compares the threshold of an output power control signal input via the input terminal 8 with the threshold value of an output power control signal. The threshold value is set to a value at which each amplifier is not saturated, and is stored in, for example, a RAM or ROM. In FIG. 2, the RAM or ROM is provided in the threshold comparison circuit 301 but may be externally connected to the threshold value comparison circuit 301. The threshold value comparison circuit 301 outputs the comparison signal to the intermediate frequency variable gain amplifier control circuit 302 and the change over control circuit 303. The intermediate frequency variable gain amplifier control circuit 302 receives the comparison signal output from the threshold comparison circuit 301 and the output from the changeover control circuit 303 and then outputs a variable gain control signal to the intermediate frequency variable gain amplifier 402. The changeover control circuit 303 receives the comparison signal from the threshold value comparison circuit 301 and the changeover timing clock signal output from the timing clock generation circuit 202 and then outputs the output to the intermediate frequency variable gain amplifier coTro circuit 33Qa nd amuffr changeover switch 6.

The signal processing section 4 consists of a modulation circuit 401, an intermediate frequency variable gain amplifier 402, and a frequency conversion circuit 403. The modulation circuit 401 modulates transmission data input via the input terminal 1. The intermediate frequency variable gain amplifier 402 receives the signal modulated by the modulation circuit 401 and then controls its output by the variable gain control signal output from the intermediate frequency variable gain amplifier control circuit 302. The frequency conversion circuit 403 converts the frequency of the output from the intermediate frequency variable gain amplifier 402 into a desired frequency and then outputs the converted signal to the amplifiers $5_1$ to $5_3$.

The amplifier $5_1$ has a gain A; the amplifier $5_3$ has a gain C. The relationship between the gains is express by A<B<C. Each output of each amplifier is input to the amplifier changeover switch 6. The output of the changeover switch 6 is connected to the duplexes 407. The antenna 408 radiates the output.

Detailed Operation

Next, the operation of the embodiment according to the present invention will be described by referring to FIGS. 2 to 4.

Figure 3:
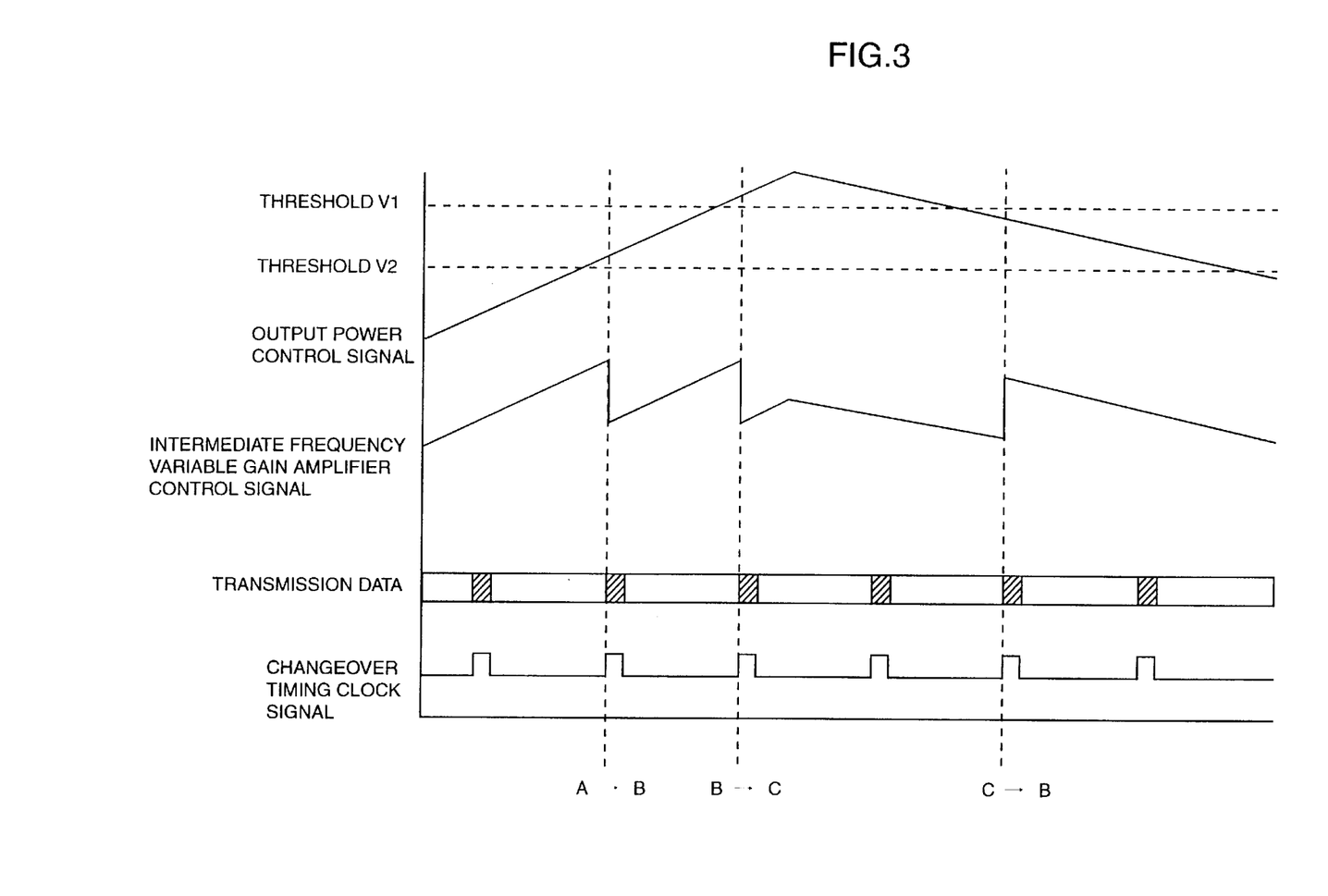
FIG. 3 is a diagram illustrating operational waveforms in a transmission amplifier control circuit according to an embodiment of the present invention.

FIG. 3 is a diagram illustrating the operational waveforms of the transmission amplifier control circuit according to an embodiment of the present invention. FIG. 4 is a diagram illustrating the relationships between variable gain control signal and output power shown in FIG. 2.

The transmission data input from the input terminal 1 contains periodically inserted pilot symbol signals. The detection section 2 detects a pilot symbol signal pattern included in the data format of the transmission data and then compares it with the pilot symbol pattern 203 stored in, for example, a ROM or RAM therein and then detects the comparison result. Based on the result, the detection section 2 produces to the amplifier changeover control circuit 3 a changeover timing clock signal by which the phase shift is not affected in the amplifier changeover operation.

Here the case will be described where the transmission amplifier control circuit has such a circuit configuration that increases the entire output power thereof as the voltage value of the output power control signal input to the input signal 8 rises, and the amplifier $5_1$ with a gain A is first selected. When the threshold value comparison section 301 detects an output power control signal value exceeding the threshold value V2, it controls the amplifier changeover switch 6 to change from the amplifier $5_1$ with a gain A to the amplifier $5_2$ with a gain B in synchronism with the rising edge of the changeover timing clock signal. Moreover, when the threshold value comparison section 301 detects an output power control signal value exceeding the threshold value V1, it controls the amplifier changeover switch 6 to change from the amplifier $5_2$ with a gain B to the amplifier $5_3$ with a gain C in synchronism with the rising edge of the changeover timing clock signal. Similarly, when the threshold value comparison section 301 detects an output power control signal value less than the threshold value V1, it controls the amplifier changeover switch 6 to change from the amplifier $5_3$ with a gain C to the amplifier $5_2$ with a gain B in synchronism with the rising edge of the changeover timing clock signal. When the threshold value comparison section 301 detects an output power control signal value less than the threshold value V2 (not shown in FIG. 3), it controls the amplifier changeover switch 6 to change from the amplifier $5_2$ with a gain B to the amplifier $5_1$ with a gain A in synchronism with the rising edge of the changeover timing clock signal.

When the intermediate frequency variable gain amplifier 402 receives an output power control signal input to the input terminal 8 without any change while an amplifier with a different gain is selected during the control of the output power, the output power output from the output terminal 6 changes instantly stepwise. In order to avoid such a phenomenon, the intermediate frequency variable gain amplifier control circuit 302 increases or decreases by an increment or decrement of the output power in agreement with the timing at which a amplifier with a different gain is selected and then inputs the result to the intermediate frequency variable gain amplifier 402.

Figure 4:
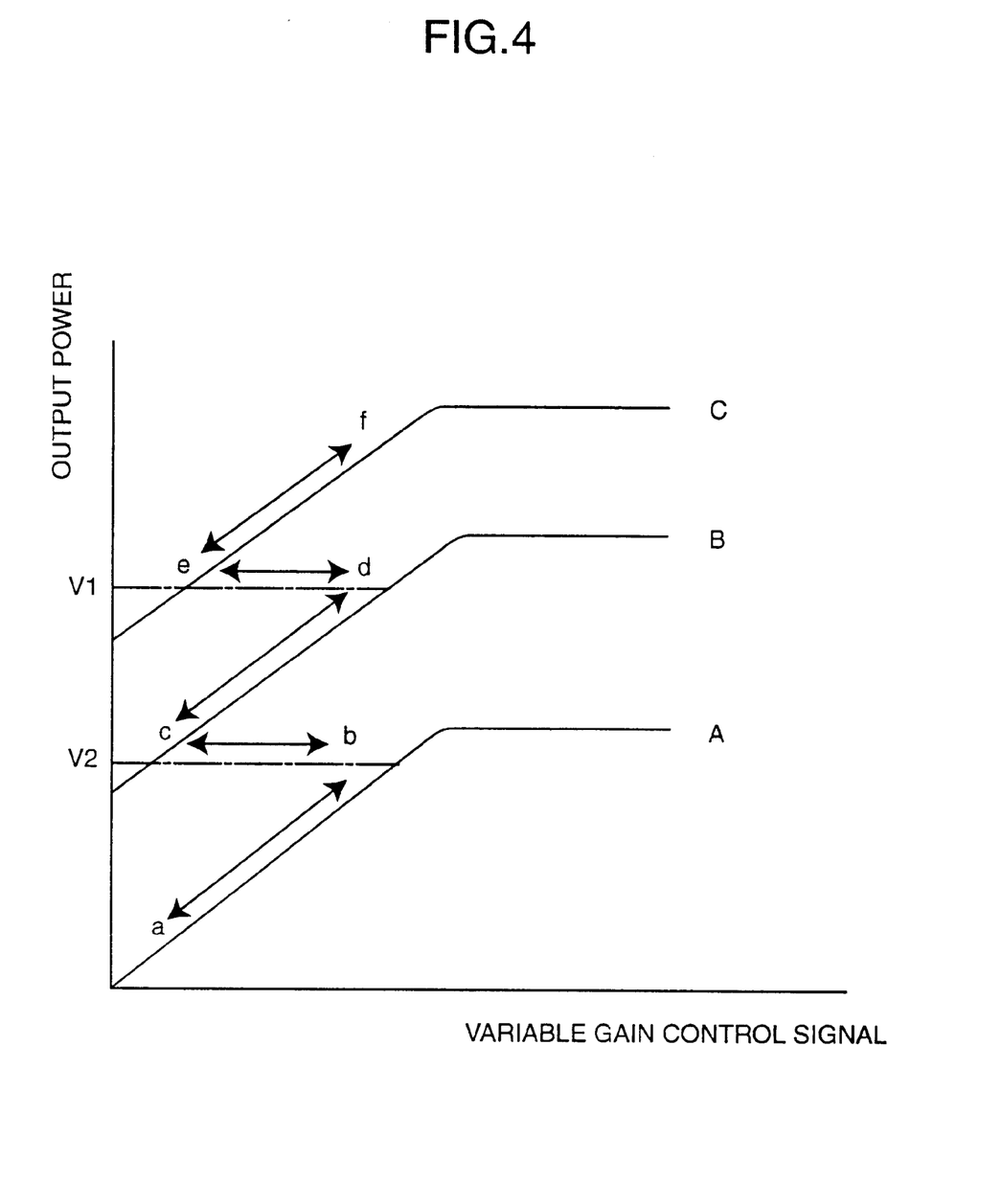
FIG. 4 is a graph illustrating the relationships between variable gain control signal and output power of the amplifier shown in FIG. 2.

As shown in FIG. 4, the output power value A of the amplifier $5_1$ changes to variable gain control signal values; the output power value B of the amplifier $5_2$ changes to variable gain control signal values; and the output power value C of the amplifier $5_3$ changes to variable gain control signal values. The output power value due to the amplifier changeover operation changes according to a→b→c→d→e→f→e→d→c→b→a, as shown in FIG.4. Actually, the output power value does not simply change as shown in FIG. 4 because of the effect of the hysteresis loop. This phenomenon is not the feature of the present invention. Hence, for an easy understanding, the explanation will be made here on condition that there is no effect of the hysteresis loop. The amplifier $5_1$ with the gain A is switched to the amplifier $5_2$ with the gain B at the threshold value V2 (between b and c). The amplifier $5_2$ with the gain B is switched to the amplifier $5_3$ with the gain C at the threshold value V1 (between d and e).

The detection section 2 according to the present invention detects a pilot symbol signal pattern according to the transmission data format. However, the same effect can be obtained by detecting the timing clock at which a pilot symbol signal is combined with transmission data at the stage of processing a baseband signal. The entire power consumption of the transmission amplifier control circuit can be reduced by controlling the power supply voltage for amplifiers not used with the amplifier changeover timing.

The first effect is that when a plurality of amplifiers connected in parallel are selectively used, an adverse effect such as a phase shift which occurs at the amplifier switching timing can be avoided. The reason is that when the detection section detects a pilot symbol signal contained in transmission data, the changeover timing clock signal for an amplifier switching operation is created, so that an amplifier is selected at the timing at which the phase shift is not affected.

The second effect is that transmission output power can be dynamically controlled. The reason is that the plurality of amplifiers can be connected in a multistage arrangement by combining amplifiers with various gains. Moreover, the output power can be accurately controlled by disposing of a variable phase shifter at the rear stage.

The third effect is that the power consumption can be reduced. The reason is that an amplifier with a small gain is selected to reduce the transmission power consumption, so that the power consumption can be reduced corresponding to the reduced gain by selecting another amplifier with the changeover switch.

As described above, the present invention can prevent an adverse effect such as data erroneous transmission due to a phase shift which occurs when amplifiers are switched. Moreover, the present invention can suppress extra power consumption through the amplifier switching control.

The entire disclosure of Japanese Patent Application No. 9-166070 filed on Jun. 23, 1997 including specification, claims, drawing and summary are incorporated herein by reference in its entirety.

What is claimed is:

1. A transmission amplifier control circuit comprising:
   plural amplification means;
   switching means for selectively switching at least one of said plural amplification means;
   detection means for detecting a timing at which said plural amplification means are switched, using the format of data to be transmitted during data transmission;
   amplification changeover control means for controlling a timing for switching said plural amplification means, using both a detection signal from said detection means and an output power control signal which is externally input and controls the output power of said transmission amplifier control circuit; and
   a signal processing section connected to said plural amplification means, the signal processing section controlling said data according to a variable gain control signal from said amplification changeover control means, wherein said signal processing section comprises:
      a modulation circuit for modulating said data to output a modulation signal,
      an intermediate frequency variable gain amplifier for controlling said modulation signal according to said variable gain control signal, and
      a frequency conversion circuit for converting a signal output from said intermediate frequency variable gain amplifier into a signal of desired frequency.

2. The transmission amplifier control circuit defined in claim 1, therein each of said plural amplification means has a different maximum gain.

3. The transmission amplifier control circuit defined in claim 1, wherein said data contains a pilot symbol signal of which the phase is handled as a reference phase at a receiving time.

4. The transmission amplifier control circuit defined in claim 1, wherein said detection means comprises a comparator for comparing a pilot symbol pattern contained in data with a pilot symbol pattern; a timing clock generation circuit for producing a changeover timing clock signal; and storage means for storing said pilot symbol pattern.

5. The transmission amplifier control circuit defined in claim 4, wherein said pilot symbol signal is periodically inserted in said data.

6. A transmission amplifier control circuit comprising:
   plural amplification means;
   switching means for selectively switching at least one of said plural amplification means;
   detection means for detecting a timing at which said plural amplification means are switched, using the format of data to be transmitted during data transmission; and
   amplification changeover control means for controlling a timing for switching said plural amplification means, using both a detection signal from said detection means and an output power control signal which is externally input and controls the output power of said transmission amplifier control circuit, wherein said amplification changeover control means comprises:
      a threshold value comparison circuit for comparing the threshold value of said output power control signal with an output power control signal value,
      an intermediate frequency variable gain amplifier control circuit for generating a control signal to an intermediate frequency gain amplifier, and
      a changeover control circuit for controlling said switching means.

7. The transmission amplifier control circuit defined in claim 6, wherein said threshold value of said output control signal is set to a value at which each of said amplification means is not saturated.

8. The transmission amplifier control circuit defined in claim 7, wherein said threshold value is stored in a ROM or RAM.

9. A method for controlling transmission amplifiers, comprising the steps of:
   detecting a pilot symbol signal pattern contained in a format of transmission data;
   comparing said pilot symbol pattern with a pilot symbol pattern stored in a memory within a detection section and then outputting a comparison result to a amplifier changeover control circuit;
   producing a changeover timing clock signal based on said comparison result so as not to adversely affect a phase shift in an amplifier switching operation;
   producing a control signal to a changeover switch and a variable gain control signal to a signal processing section, in synchronism with said changeover timing clock signal; and
   selecting an amplifier with a predetermined gain among said transmission amplifiers by controlling said amplifier changeover switch based on said control signal.

10. The method defined in claim 9, wherein said pilot symbol signal detecting step comprises a step of detecting a timing clock signal at which a pilot symbol signal is combined with said transmission data in a baseband signal processing step.

11. A transmission amplifier control circuit comprising:
    an output circuit receiving data to be transmitted;
    an output power control signal input circuit receiving an output power control signal;
    a plurality of amplifiers;
    a switch coupled to the plurality of amplifiers, the switch selectively switching the plurality of amplifiers;
    detection circuit coupled to the input circuit and detecting a timing at which the plurality of amplifiers are to be switched, the detection circuit performing the detection using the format of the data;
    an amplification changeover control circuit coupled to the switch, coupled to the detection circuit and coupled to the output power control signal input circuit, the amplification changeover control circuit controlling a timing for switching the plurality of amplifiers, using both a detection signal from the detection circuit and the output power control signal; and
    a signal processing circuit coupled to the plurality of amplifiers and coupled to the input circuit, the signal processing circuit controlling the data according to a variable gain control signal from said amplification changeover control circuit, wherein said signal processing circuit comprises:
a modulation circuit modulating the data to output a modulation signal,
an intermediate frequency variable gain amplifier controlling the modulation signal according to the variable gain control signal, and
a frequency conversion circuit for converting a signal output from the intermediate variable gain amplifier into a signal of a desired frequency.

12. A transmission amplifier control circuit comprising:
an input circuit receiving data to be transmitted;
an output power control signal input circuit receiving an output power control signal;
a plurality of amplifiers;
a switch coupled to the plurality of amplifiers, the switch selectively switching the plurality of amplifiers;
detection circuit coupled to the input circuit and detecting a timing at which the plurality of amplifiers are to be switched, the detection circuit performing the detection using the format of the data;
an amplification changeover control circuit coupled to the switch, coupled to the detection circuit and coupled to the output power control signal input circuit, the amplification changeover control circuit controlling a timing for switching the plurality of amplifiers, using both a detection signal from the detection circuit and the output power control signal, wherein said amplification changeover control circuit comprises:
a threshold value comparison circuit comparing a threshold value of said output power control signal with a value of the output power control signal,
an intermediate frequency variable gain amplifier control circuit generating a control signal to an intermediate frequency gain amplifier, and
a changeover control circuit for controlling the switch.

* * * * *